United States Patent
Patak et al.

(10) Patent No.: US 10,928,462 B2
(45) Date of Patent: Feb. 23, 2021

(54) MAGNETIC FIELD SENSOR AND METHOD FOR MEASURING AN EXTERNAL MAGNETIC FIELD

(71) Applicant: Robert Bosch GmbH, Stuttgart (DE)

(72) Inventors: Christian Patak, Reutlingen (DE); Achim Breitling, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 275 days.

(21) Appl. No.: 16/094,605

(22) PCT Filed: May 9, 2017

(86) PCT No.: PCT/EP2017/061095
§ 371 (c)(1),
(2) Date: Oct. 18, 2018

(87) PCT Pub. No.: WO2017/194560
PCT Pub. Date: Nov. 16, 2017

(65) Prior Publication Data
US 2020/0326386 A1    Oct. 15, 2020

(30) Foreign Application Priority Data
May 13, 2016  (DE) .......................... 102016208314.7

(51) Int. Cl.
*G01R 33/00*  (2006.01)
*G01R 33/09*  (2006.01)

(52) U.S. Cl.
CPC ........ *G01R 33/0011* (2013.01); *G01R 33/098* (2013.01)

(58) Field of Classification Search
CPC .......................... G01R 33/0011; G01R 33/098
See application file for complete search history.

(56) References Cited

U.S. PATENT DOCUMENTS 7,839,242 B1   11/2010  Hopper et al.
9,488,496 B2 *  11/2016  Stanley .................. G01D 5/145
2013/0207754 A1   8/2013  Edelstein et al.
(Continued)

FOREIGN PATENT DOCUMENTS

CN         1657967 A    8/2005
CN        102292648 A   12/2011
(Continued)

OTHER PUBLICATIONS

International Search Report for PCT/EP2017/061095, dated Aug. 7, 2017.

*Primary Examiner* — Reena Aurora
(74) *Attorney, Agent, or Firm* — Norton Rose Fulbright US LLP; Gerard Messina

(57) ABSTRACT

A magnetic field sensor for measuring an external magnetic field, including a sensor unit; and a flux conductor assembly including at least one switchable element, which is designed to deflect a flux of the external magnetic field onto the sensor unit as a function of a switching state of the at least one switchable element, the sensor unit being designed to measure the deflected flux of the external magnetic field; and an evaluation unit, which is designed to ascertain a value of the external magnetic field as a function of the deflected flux of the external magnetic field measured by the sensor unit and the switching state of the at least one switchable element.

9 Claims, 5 Drawing Sheets

(56) References Cited

U.S. PATENT DOCUMENTS

2013/0320969 A1* 12/2013 Reichenbach ..... G01R 33/0052
324/247
2015/0331065 A1 11/2015 Engel et al.

FOREIGN PATENT DOCUMENTS

| CN | 103969606 A | 8/2014 |
| WO | 2009019025 A1 | 2/2009 |

* cited by examiner

MAGNETIC FIELD SENSOR AND METHOD FOR MEASURING AN EXTERNAL MAGNETIC FIELD

FIELD

The present invention relates to a magnetic field sensor for measuring an external magnetic field and a method for measuring an external magnetic field.

BACKGROUND INFORMATION

To be able to detect small magnetic fields, for example, the earth's magnetic field, as accurately as possible using mobile devices, low-noise measuring systems having a low power consumption are required. Sensors for measuring magnetic fields are known for this purpose in numerous variations which are based on various physical measuring principles. However, if one attempts to minimize the noise value by averaging over longer periods of time, the problem results that a limitation of the measurement accuracy is given in principle by 1/f noise.

To suppress the 1/f noise, the spinning current technology is conventional for Hall sensors, in which the current direction inside the Hall sensor is varied in a predefined sequence. The measuring direction of the Hall sensor is reversed by the current direction continuously changing in this way. It is possible to differentiate between an offset, which is induced by the 1/f noise, and the actual signal, which indicates the strength of the magnetic field, by a rapid periodic reversal of the measuring current. Such a spinning current Hall sensor is described in PCT Application No. WO 2009/019025 A1.

However, TMR sensors or GMR sensors are preferably employed for the usage for mobile devices, since they are more power-saving than Hall sensors. TMR sensors are based on the tunnel magnetoresistance (TMR), the tunnel current changing as a function of the magnetic orientation of two thin magnetic layers. GMR sensors are based on the giant magnetoresistance (GMR), which occurs in structures which have various magnetic and nonmagnetic thin layers. The electrical resistance is dependent in this case on the mutual orientation of the magnetization of these various layers.

TMR sensors and GMR sensors have a strong 1/f noise. The direct application of the spinning current principle of the Hall sensors is not applicable for TMR sensors and GMR sensors, however, since a reversal of the measuring current does not result in an inversion of the measuring signal.

SUMMARY

The present invention provides a magnetic field sensor for measuring an external magnetic field, and a method for measuring an external magnetic field.

According to a first aspect of the present invention, a magnetic field sensor for measuring an external magnetic field is provided, which includes a sensor unit and a flux conductor assembly. The flux conductor assembly includes at least one switchable element, which is designed to deflect a flux of the external magnetic field onto the sensor unit as a function of a switching state of the at least one switchable element. Furthermore, the sensor unit is designed to measure the deflected flux of the external magnetic field. In addition, the magnetic field sensor includes an evaluation unit, which is designed to ascertain a value of the external magnetic field as a function of the deflected flux of the external magnetic field, which was measured by the sensor unit, and the switching state of the at least one switchable element.

According to another aspect of the present invention, the present invention relates to a method for measuring an external magnetic field, in a first method step, the flux of the external magnetic field being deflected by a flux conductor assembly onto a sensor unit as a function of a switching state of at least one switchable element of the flux conductor assembly. In a further method step, the flux of the deflected magnetic field is measured by the sensor unit and subsequently a value of the external magnetic field is ascertained as a function of the measured flux of the deflected magnetic field and the switching state of the at least one switchable element.

Preferred specific embodiments of the present invention are described herein.

The present invention provides a magnetic field sensor which has a strongly reduced noise behavior, since 1/f noise contributions may be computed out. For this purpose, the external magnetic field is redirected accordingly by changing the switching state of the switchable element. Similarly to the spinning current principle of the Hall sensors, a periodic reversal of the deflected flux measured by the sensor unit in various switching states may be achieved by the modulation and/or deflection of the external magnetic field. It is possible to differentiate between the offset and the signal, which indicates the actual dimension of the external magnetic field, by way of such a magnetic modulation of the external magnetic field.

According to one preferred refinement of the magnetic field sensor, the at least one switchable element is arranged in such a way that the flux of the external magnetic field is deflected in a first and/or second switching state of the at least one switchable element onto the sensor unit in directions which are inverted with respect to a measuring direction of the sensor unit. By changing the switching state of the switchable elements, the flux direction of the magnetic field incident on the sensor unit may thus be reversed in polarity.

According to one preferred refinement of the present invention, the sensor unit includes at least one TMR sensor element and/or GMR sensor element.

According to one preferred refinement of the magnetic field sensor, the switchable element includes a flux conductor element for deflecting the flux of the external magnetic field, which is switchable between a saturated state and an unsaturated state. A flux conductor element is understood as a component made of a magnetizable material which is designed for conducting and deflecting an external magnetic field. In a saturated state, the material of the flux conductor element reaches the saturation magnetization, so that the magnetic conductivity of the flux conductor element decreases strongly. Such a flux conductor element therefore has the advantage that a deflection of the flux of the external magnetic field may be carried out as a function of a switching state, since the flux conductor element may conduct the flux of the external magnetic field well in the unsaturated state, while the flux of the external magnetic field may not be conducted or may only be conducted slightly in the saturated state.

According to one preferred refinement of the magnetic field sensor, the switchable element includes a magnetic field generating unit, which is designed to switch between the saturated state and the unsaturated state of the flux conductor element by applying a magnetic control field. By applying a large magnetic control field, the flux conductor element may be brought into the saturated state and thus may no longer conduct the flux of the external magnetic field.

According to one preferred refinement, the magnetic field sensor includes a control unit, which is designed to switch between the saturated state and the unsaturated state of the flux conductor element by adapting a current intensity of a current which flows through a conductor situated in the flux conductor element. A magnetic field is induced in the flux conductor element as a function of the current intensity, so that the flux conductor element may be brought into the saturated state by applying a sufficiently great current intensity.

According to one preferred refinement of the magnetic field sensor, the switchable element includes a temperature control unit, which is designed to switch between the saturated state and the unsaturated state of the flux conductor element by adapting a temperature of the flux conductor element. Since the magnetization is dependent on the applied temperature, it is possible to switch back-and-forth between the saturated state and the unsaturated state by changing the temperature.

According to one preferred refinement of the magnetic field sensor, the flux conductor assembly includes a magnetizable shielding device, which is designed to shield the sensor unit at least in areas from the external magnetic field. The at least one switchable element includes a conductor, which may be switched on and off and through which a current flows. The conductor is situated on the shielding device and is designed to saturate a magnetic field inducible in the shielding device in a subarea, so that the flux of the external magnetic field through the subarea is deflected to the sensor unit. Depending on the switching state, the flux of the external magnetic field may be intentionally deflected onto the sensor unit. In particular, the direction in which the flux of the external magnetic field is deflected onto the sensor unit may be inverted in various switching states.

According to one preferred refinement of the method according to the present invention, the switching state of the at least one switchable element is periodically changed and the external magnetic field is ascertained by comparing mean values, which are ascertained by averaging over the values of the flux of the deflected magnetic field measured in the particular switching states. An offset may be computed by the periodic change and thus 1/f noise may be computed out.

DETAILED DESCRIPTION OF EXAMPLE EMBODIMENTS

Figure 1:
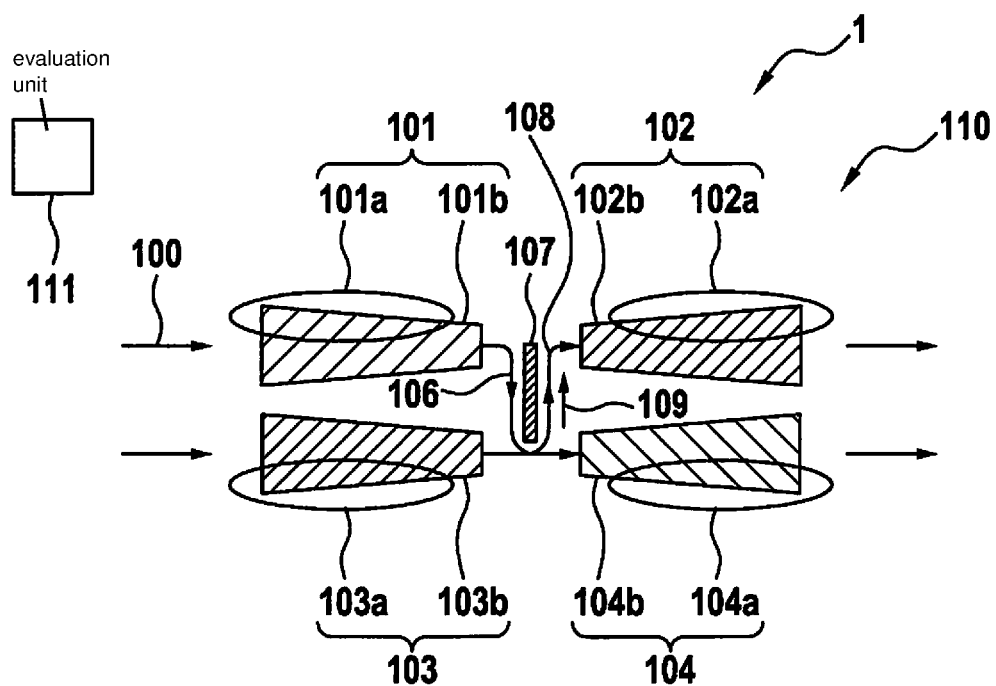
FIG. 1 shows a schematic top view of a magnetic field sensor according to a first specific embodiment.

In all figures, identical or functionally identical elements and devices are provided with the same reference numerals. Specific embodiments may be arbitrarily combined with one another, if not otherwise indicated.

FIG. 1 shows a schematic top view of a magnetic field sensor 1 for measuring an external magnetic field 100. Magnetic field sensor 1 includes a sensor unit 107, which is preferably designed as a TMR sensor or GMR sensor. According to other specific embodiments, however, sensor unit 107 may also include a plurality of TMR sensor elements and/or GMR sensor elements. Sensor unit 107 may thus include three TMR sensor elements and/or GMR sensor elements, which are preferably situated at right angles in relation to one another, and are designed to measure a three-dimensional profile of external magnetic field 100.

Furthermore, magnetic field sensor 1 includes a flux conductor assembly 110, which includes four switchable elements 101, 102, 103, 104, which are situated around sensor unit 107. Switchable elements 101, 102, 103, 104 each include a flux conductor element 101b, 102b, 103b, 104b, which is formed from a magnetizable material, in particular nickel or iron, and is oriented to deflect the flux of external magnetic field 100. Flux conductor elements 101b through 104b have an oblong shape, a longitudinal direction being oriented perpendicularly in relation to a measuring direction 109 of sensor unit 107.

Magnetic field sensor 1 is preferably oriented in such a way that the direction of external magnetic field 100 is in parallel to the longitudinal direction of flux conductor elements 101b through 104b. However, the present invention is not restricted thereto, but rather is applicable for arbitrary orientations of magnetic field sensor 1.

Furthermore, switchable elements 101 through 104 include magnetic field generating units 101a through 104a, for example, magnetic coils, which are each situated adjacent to flux conductor elements 101b through 104b and are designed to bring corresponding flux conductor element 101b through 104b from an unsaturated state into a saturated state by generating a magnetic control field. It is therefore possible to switch between a saturated state and an unsaturated state of flux conductor elements 101b through 104b by applying and switching off the magnetic control field by way of magnetic field generating units 101a through 104a. Magnetic field generating units 101a through 104a are preferably configured in such a way that the generated magnetic control field does not influence or only slightly influences particular other flux conductor elements 101b through 104b.

Flux conductor elements 101b through 104b are situated in such a way that in a first switching state, the flux of external magnetic field 100 is deflected in measuring direction 109 of sensor unit 107.

In the first switching state, upper left flux conductor element 101b and lower right flux conductor element 104b are brought into a saturated state, so that they do not conduct the flux of external magnetic field 100, while lower left flux conductor element 103b and upper right flux conductor element 102b are brought into an unsaturated state and conduct the flux of external magnetic field 100. The flux of the external magnetic field is therefore deflected in such a way that the flux of external magnetic field 100 is deflected by lower left flux conductor element 103b toward a lower end of sensor unit 107 and is deflected further along a first deflection direction 108, which essentially corresponds to measuring direction 109, to upper right flux conductor element 102b and through it. Sensor unit 107 is designed to measure the deflected flux of external magnetic field 100.

In a second switching state, the flux of external magnetic field 100 is deflected against measuring direction 109 of sensor unit 107.

For this purpose, lower left flux conductor element 103b and upper right flux conductor element 102b are brought into a saturated state, so that they do not conduct the flux of external magnetic field 100, while upper left flux conductor element 101b and lower right flux conductor element 104b are brought into an unsaturated state and conduct the flux of external magnetic field 100. The flux of the external magnetic field is deflected in such a way that the flux of external magnetic field 100 is deflected by upper left flux conductor element 101b toward an upper end of sensor unit 107 and further along a second deflection direction 106, which is essentially opposite to measuring direction 109, to lower right flux conductor element 104b and through it. Sensor unit 107 is designed to measure the deflected flux of external magnetic field 100.

The flux of external magnetic field 100 is therefore deflected in a first deflection direction 108 in the first switching state of switchable elements 101 through 104, which is opposite to second deflection direction 106 in the second switching state of switchable elements 101 through 104. It is therefore possible to invert the deflection direction of the flux of external magnetic field 100 onto sensor unit 107 by changing the switching states.

Flux conductor elements 101b through 104b preferably have a shape which tapers in the longitudinal direction toward sensor unit 107 in order to focus the flux of external magnetic field 100 toward sensor unit 107.

Neither the shape nor the number or precise position of switchable elements 101 through 104 is established.

Furthermore, magnetic field sensor 1 includes an evaluation unit 111, which is designed to ascertain a value of external magnetic field 100 as a function of the deflected flux of external magnetic field 100 measured by sensor unit 107, and also the switching state of switchable elements 101 through 104. The ascertainment may be carried out for this purpose similarly to a spinning current method for Hall sensors known from the related art.

According to one specific embodiment, the switching states of switching elements 101 through 104 may be periodically changed between the first switching state and the second switching state. Evaluation unit 111 is designed to determine a first magnetic field value or second magnetic field value by averaging over the values of the deflected flux of external magnetic field 100 measured by sensor unit 107 in the first switching state or second switching state, respectively. Evaluation unit 111 is furthermore designed to ascertain the value of external magnetic field 100 by comparing the first magnetic field value and the second magnetic field value. Evaluation unit 111 computes an offset in this case by way of the comparison on the basis of the 1/f noise and the actual value of external magnetic field 100.

Figure 2:
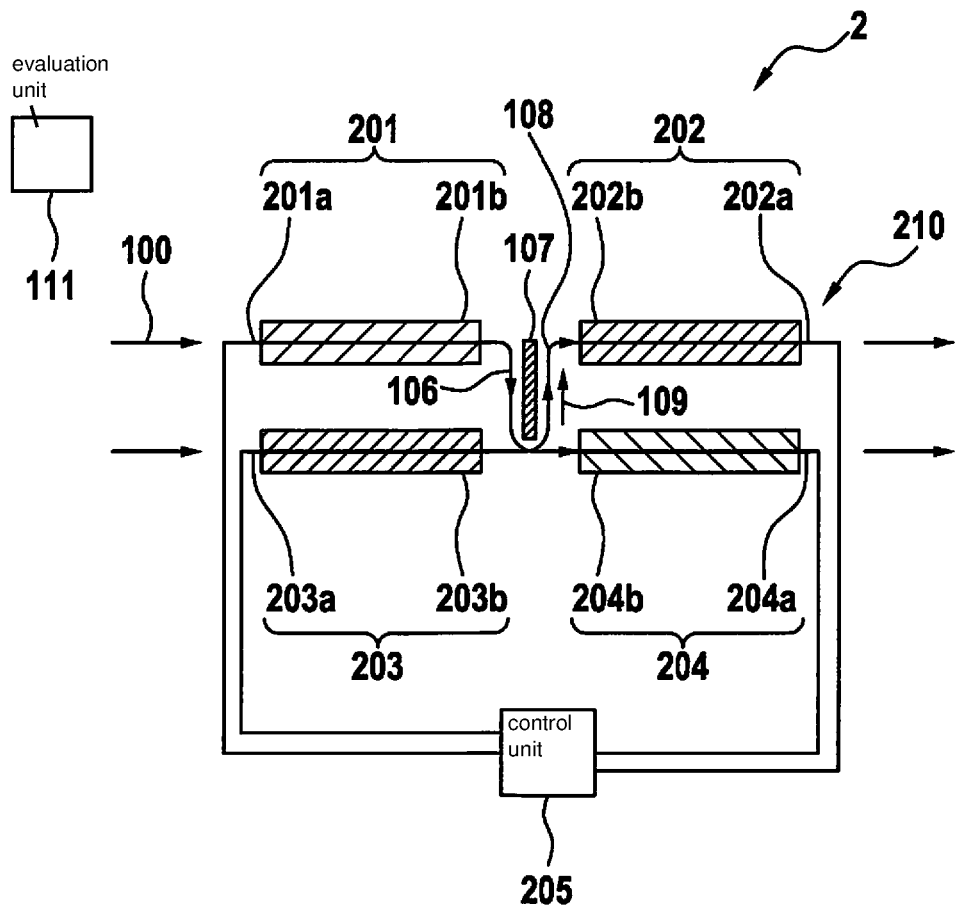
FIG. 2 shows a schematic top view of a magnetic field sensor according to a second specific embodiment.
Figure 3:
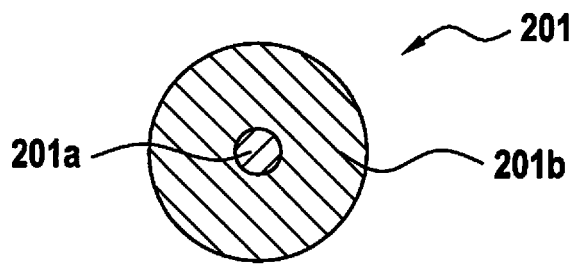
FIG. 3 shows a schematic cross-sectional view of a flux conductor element according to the second specific embodiment.

FIG. 2 illustrates a top view of a magnetic field sensor 2 according to a second specific embodiment of the present invention, which differs from the first specific embodiment in the design of flux conductor assembly 210. This assembly includes four switchable elements 201 through 204, which include flux conductor elements 201b through 204b made of a magnetizable material, in particular nickel or iron, which are formed around a particular conductor 201a through 204a and have, for example, a cylindrical shape. An exemplary cross section of such a switchable element 201 is illustrated in FIG. 3.

A control unit 205 is designed to control a current intensity which flows through corresponding conductor 201a through 204a in order to thus switch between the saturated state and the unsaturated state of corresponding flux conductor element 201b through 204b. In the case of a high current intensity, a strong magnetic field is induced, so that flux conductor element 201b through 204b changes or switches into the saturated state, and upon reduction or switching off of the current intensity, flux conductor element 201b through 204b changes back into the unsaturated state. The arrangement and mode of action of magnetic field sensor 2 otherwise corresponds to the first specific embodiment and will therefore not be repeated.

Figure 4:
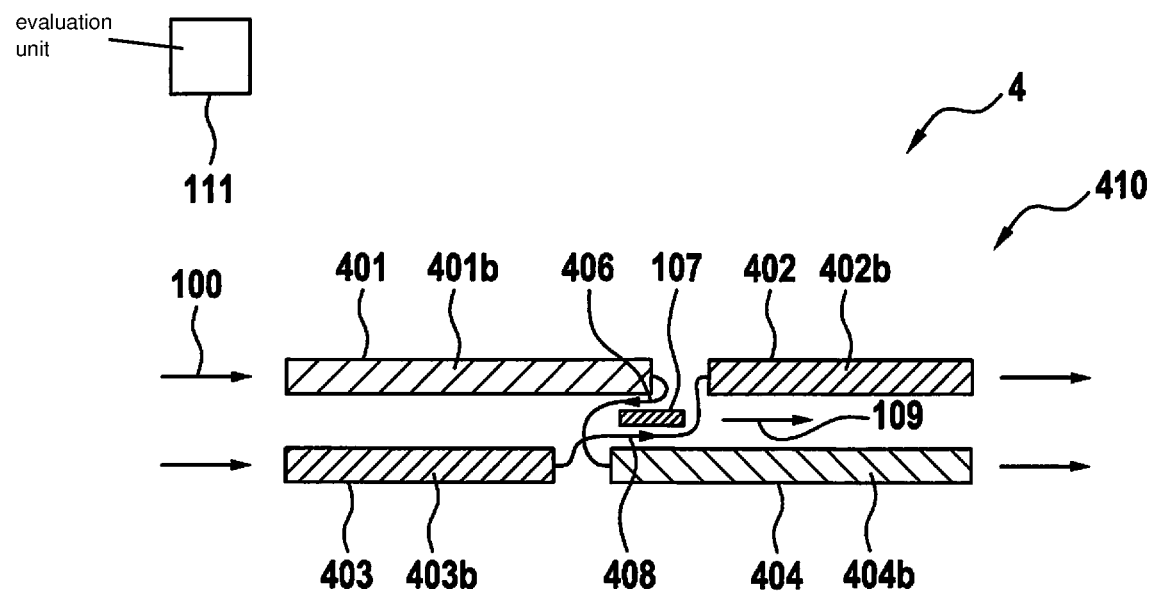
FIG. 4 shows a schematic cross-sectional view of a magnetic field sensor according to a third specific embodiment.
Figure 5:
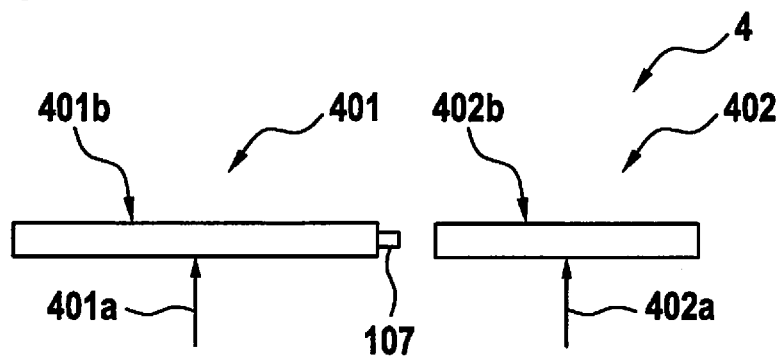
FIG. 5 shows a schematic top view of a magnetic field sensor according to the third specific embodiment.

FIG. 4 shows a cross-sectional view and FIG. 5 shows a top view of a magnetic field sensor 4 according to another specific embodiment of the present invention. A flux conductor assembly 410 of magnetic field sensor 4 includes four switchable elements 401 through 404. Switchable elements 401 through 404 have an oblong shape, the longitudinal direction corresponding to measuring direction 109 of sensor unit 107. Upper left switchable element 401 and upper right switchable element 404 have a greater length than lower left switchable element 403 and upper right switchable element 402. Upon projection on the longitudinal direction, there is therefore an overlap area between upper left switchable element 401, lower right switchable element 404, and sensor unit 107 situated between flux conductor elements 401 through 404.

Magnetic field sensor 4 is preferably oriented in such a way that measuring direction 109 of sensor unit 107 is oriented parallel to external magnetic field 100.

As shown by way of example in FIG. 5 for upper left switchable element 401 and upper right switchable element 402, switchable elements 401 through 404 have respective flux conductor elements 401b through 404b and actuators 401a, 402a, actuators 401a, 402a being designed to actuate flux conductor elements 401b, 402b in such a way that they may be switched between a saturated state and an unsaturated state. Actuators 401a, 402a may include a magnetic field generating unit 101a through 104a illustrated in FIG. 1, but may also include a temperature control unit, which is designed to switch between the saturated state and the unsaturated state of flux conductor elements 401b, 402b by adapting a temperature of flux conductor elements 401b through 404b.

According to another specific embodiment, actuators 401a, 402a may be designed to apply a pressure to flux conductor elements 401b, 402b.

Flux conductor elements 401b through 404b are situated in such a way that in a first switching state or second switching state, the flux of external magnetic field 100 is deflected in measuring direction 109 or against the measuring direction of sensor unit 107, respectively.

In the first or second switching state, upper left flux conductor element 101b and lower right flux conductor element 104b are brought into a saturated or unsaturated state, while lower left flux conductor element 103b and upper right flux conductor element 102b are brought into an unsaturated or saturated state, respectively. In the first or second switching state, the flux of external magnetic field 100 is therefore deflected in a first deflection direction 408, which essentially corresponds to measuring direction 109, or second deflection direction 406, which is essentially opposite to measuring direction 109. The further mode of action corresponds to the above-described specific embodiments.

Figure 6:
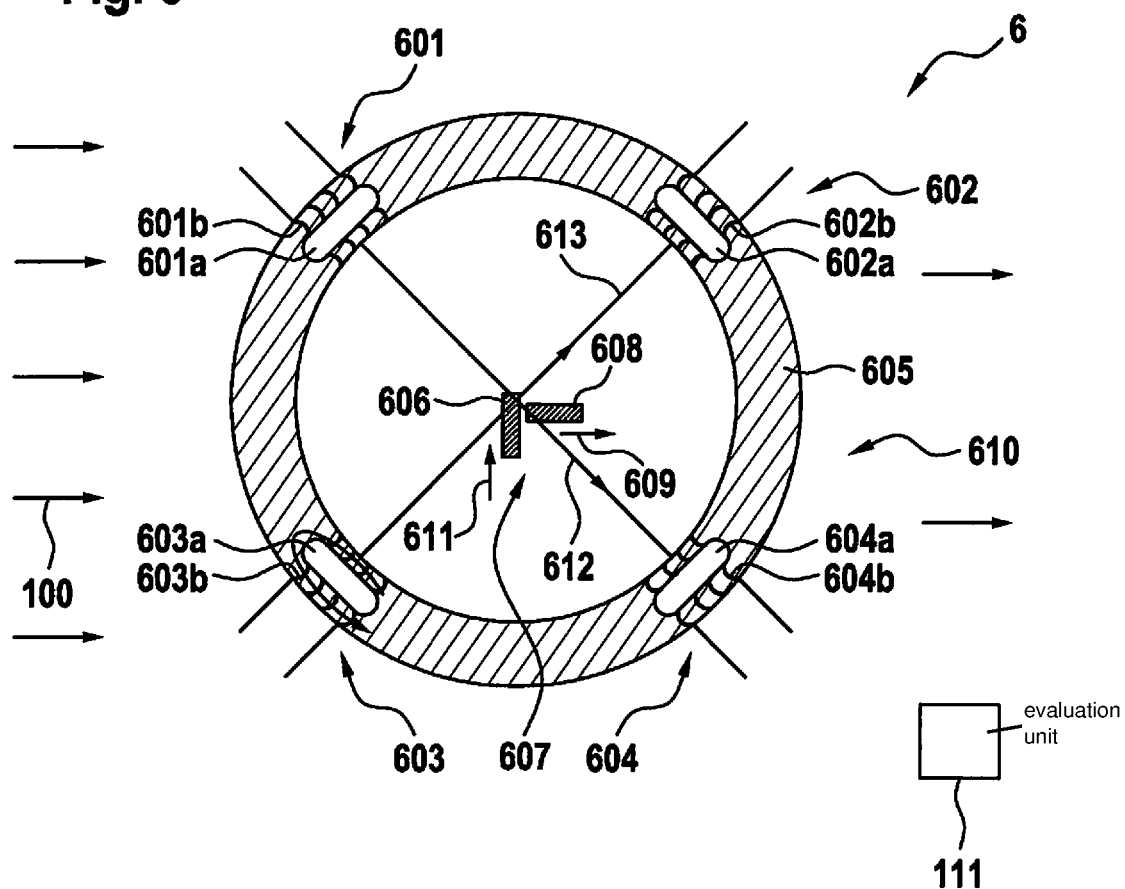
FIG. 6 shows a schematic cross-sectional view of a magnetic field sensor according to a fourth specific embodiment.

A magnetic field sensor 6 according to a fourth specific embodiment of the present invention is illustrated in FIG. 6.

Magnetic field sensor 6 includes a shielding device 605, which is formed from a magnetizable material, in particular nickel or iron, is situated in a ring shape around a sensor unit 607, and shields sensor unit 607 at least in areas from external magnetic field 100. Sensor unit 607 includes a first sensor element 606 and a second sensor element 608, which are situated at right angles to one another and have a first measuring direction 611 and second measuring direction 609, respectively. Four switchable elements 601 through 604 are situated on shielding device 605. Switchable elements 601 through 604 each include a hole 601a through 604a situated in ring-shaped shielding device 605, and conductors 601b through 604b, which are wound around shielding device 605 through particular hole 601a through 604a. Conductors 601b through 604b form a coil, a particular subarea of shielding device 605 around particular hole 601a through 604a being switchable between a saturated state and an unsaturated state by switching a current on and off by way of a control unit (not shown) of magnetic field sensor 6.

If a particular subarea is in a saturated state, external magnetic field 100 is thus no longer shielded, but rather is deflected through corresponding hole 601a through 604a toward sensor unit 607.

Switchable elements 601 through 604 are each situated offset by 90° on magnetizable shielding device 605. In a first switching state, subareas around holes 601a, 604a of upper left switchable element 601 and lower right switchable element 604, respectively, are in a saturated state due to setting of the current intensity through corresponding conductors 601b, 604b, while subareas around lower left switchable element 603 and upper right switchable element 602 are in an unsaturated state by switching off the current intensity through corresponding conductors 603b, 602b, so that the flux of external magnetic field 100 may penetrate through the subarea around hole 603a of upper left switchable element 601 to sensor unit 607 and may exit again along a first deflection direction 612 through a subarea of shielding device 605 around hole 602a of lower right switchable element 604.

In a second switching state, subareas around holes 601a, 604a of upper left switchable element 601 and lower right switchable element 604, respectively, are in an unsaturated state due to switching off of the current intensity through corresponding conductors 601b, 604b, while subareas around lower left switchable element 603 and upper right switchable element 602 are in a saturated state due to setting of the current intensity through corresponding conductors 603b, 602b, so that the flux of external magnetic field 100 may penetrate through the subarea around hole 603a of lower left switchable element 603 to sensor unit 607 and may exit again along a second deflection direction 613, which is rotated by 90° in comparison to first deflection direction 612, through a subarea of shielding device 605 around hole 602a of upper right switchable element 602.

The further evaluation takes place similarly to the above-described specific embodiments.

Figure 7:
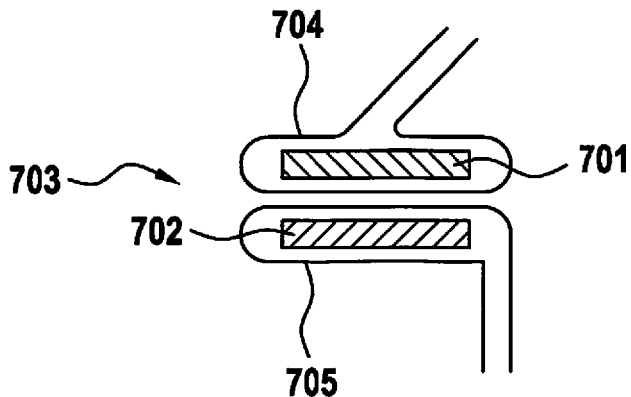
FIG. 7 shows a schematic cross-sectional view of a shielding device according to another specific embodiment.

According to another specific embodiment, the flux conductor assembly includes, in contrast to the fourth specific embodiment in FIG. 7, shielding device 703 partially illustrated in cross section, which is made up of two magnetizable ring-shaped shields 701, 702 lying one on top of the other. Shielding rings 701, 702 correspond to shielding device 605 of the fourth specific embodiment. Instead of conductors 601b through 604b illustrated in FIG. 6, shielding rings 701, 702 are wound with conductors 704, 705 in the areas of switchable elements 601 through 604, whereby a magnetic field is inducible by adapting a current intensity and therefore a subarea of shielding device 703 around conductors 704, 705 may be brought from an unsaturated state into a saturated state. The mode of action otherwise corresponds to the fourth specific embodiment.

Figure 8:
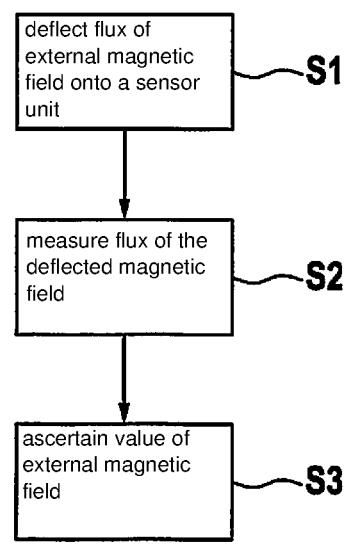
FIG. 8 shows a flow chart of a method according to the present invention for measuring an external magnetic field according to one specific embodiment.

FIG. 8 shows a flow chart to explain a method for measuring an external magnetic field. In a first step S1, the flux of the external magnetic field is deflected onto a sensor unit by a flux conductor assembly as a function of a switching state of at least one switchable element of the flux conductor assembly. One of the above-described magnetic field sensors is preferably used for this purpose.

In a second step S2, the flux of the deflected magnetic field is measured by the sensor unit. In a further step S3, a value of external magnetic field 100 is ascertained as a function of the measured flux of the deflected magnetic field and the switching state of the at least one switchable element.

According to another specific embodiment, the switching state of the at least one switchable element is periodically changed. External magnetic field 100 may be ascertained by comparison of mean values, which are computed by averaging the values of the flux of deflected magnetic field 100 measured in the particular switching states.

What is claimed is:

1. A magnetic field sensor for measuring an external magnetic field, comprising:
   a sensor unit; and
   a flux conductor assembly including at least one switchable element, which is designed to deflect a flux of the external magnetic field onto the sensor unit as a function of a switching state of the at least one switchable element, the sensor unit being designed to measure the deflected flux of the external magnetic field; and
   an evaluation unit which is designed to ascertain a value of the external magnetic field as a function of the deflected flux of the external magnetic field measured by the sensor unit and the switching state of the at least one switchable element;
   wherein the switchable element includes a flux conductor element for deflecting the flux of the external magnetic field, which is switchable between a saturated state and an unsaturated state.

2. The magnetic field sensor as recited in claim 1, wherein the at least one switchable element is situated in such a way that the flux of the external magnetic field is deflected onto the sensor unit in directions inverted with respect to the measuring direction of the sensor unit in a first or second switching state of the at least one switchable element.

3. The magnetic field sensor as recited in claim 1, wherein the sensor unit includes at least one TMR sensor element and/or GMR sensor element.

4. The magnetic field sensor as recited in claim 1, wherein the switchable element includes a magnetic field generating unit which is designed to switch between the saturated state and the unsaturated state of the flux conductor element by applying a magnetic control field.

5. The magnetic field sensor as recited in claim 1, including a control unit, which is designed to switch between the saturated state and the unsaturated state of the flux conductor element by adapting a current intensity of a current which flows through a conductor situated in the flux conductor element.

6. The magnetic field sensor as recited in claim 1, wherein the switchable element includes a temperature control unit, which is designed to switch between the saturated state and the unsaturated state of the flux conductor element by adapting a temperature of the flux conductor element.

7. The magnetic field sensor as recited in claim 1, wherein the flux conductor assembly includes a magnetizable shielding device, which is designed to shield the sensor unit at least in areas from the external magnetic field, and the at least one switchable element includes a conductor through which a current flows which may be switched on and off, and which is situated on the shielding device and is designed to saturate a magnetic field inducible in the shielding device in a subarea, so that the flux of the external magnetic field is deflected through the subarea to the sensor unit.

8. A method for measuring an external magnetic field, comprising:

deflecting a flux of the external magnetic field onto a sensor unit by a flux conductor assembly as a function of a switching state of at least one switchable element of the flux conductor assembly;

measuring the flux of the deflected magnetic field by the sensor unit; and ascertaining a value of the external magnetic field as a function of the measured flux of the deflected magnetic field and the switching state of the at least one switchable element;

wherein the switching state of the at least one switchable element is periodically changed, and the external magnetic field is ascertained by comparing mean values, the mean values being computed by averaging over values of the flux of the deflected magnetic field measured in the switching state.

9. A magnetic field sensor for measuring an external magnetic field, comprising:

a sensor unit; and a flux conductor assembly including at least one switchable element, which is designed to deflect a flux of the external magnetic field onto the sensor unit as a function of a switching state of the at least one switchable element, the sensor unit being designed to measure the deflected flux of the external magnetic field; and an evaluation unit which is designed to ascertain a value of the external magnetic field as a function of the deflected flux of the external magnetic field measured by the sensor unit and the switching state of the at least one switchable element;

wherein the flux conductor assembly includes a magnetizable shielding device, which is designed to shield the sensor unit at least in areas from the external magnetic field, and the at least one switchable element includes a conductor through which a current flows which may be switched on and off, and which is situated on the shielding device and is designed to saturate a magnetic field inducible in the shielding device in a subarea, so that the flux of the external magnetic field is deflected through the subarea to the sensor unit.

\* \* \* \* \*